United States Patent
Lee et al.

(10) Patent No.: US 10,717,878 B2
(45) Date of Patent: Jul. 21, 2020

(54) ANTI-REFLECTION COATING COMPOSITION AND ANTI-REFLECTION FILM UTILIZING SAME

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Gyeong Guk Ham, Daegu (KR)

(73) Assignee: YOUNG CHANG CHEMICAL CO., LTD, Seongju-Gun, Gyeongsangbuk-Do (KR)

( * ) Notice: Subject to any disclaimer, the term of this patent is extended or adjusted under 35 U.S.C. 154(b) by 33 days.

(21) Appl. No.: 16/070,662

(22) PCT Filed: Jan. 17, 2017

(86) PCT No.: PCT/KR2017/000546
§ 371 (c)(1),
(2) Date: Jul. 17, 2018

(87) PCT Pub. No.: WO2017/126859
PCT Pub. Date: Jul. 27, 2017

(65) Prior Publication Data
US 2018/0319994 A1    Nov. 8, 2018

(30) Foreign Application Priority Data

Jan. 18, 2016 (KR) .................. 10-2016-0006083

(51) Int. Cl.

| | |
|---|---|
| *C09D 5/06* | (2006.01) |
| *C09D 5/00* | (2006.01) |
| *C09D 183/06* | (2006.01) |
| *C03C 1/00* | (2006.01) |
| *C03C 17/02* | (2006.01) |
| *C09D 7/61* | (2018.01) |
| *C03C 17/30* | (2006.01) |

(52) U.S. Cl.
CPC ............... *C09D 5/006* (2013.01); *C03C 1/00* (2013.01); *C03C 17/02* (2013.01); *C03C 17/30* (2013.01); *C09D 5/00* (2013.01); *C09D 7/61* (2018.01); *C09D 183/06* (2013.01); *C03C 2217/732* (2013.01); *C03C 2217/78* (2013.01); *C03C 2218/11* (2013.01)

(58) Field of Classification Search
None
See application file for complete search history.

(56) References Cited

U.S. PATENT DOCUMENTS

| | | | | |
|---|---|---|---|---|
| 4,283,513 A | * | 8/1981 | Mikami | C08G 59/4085 525/476 |
| 4,950,779 A | * | 8/1990 | Wengrovius | C08G 77/06 556/457 |
| 5,683,501 A | * | 11/1997 | Tomihisa | C08F 8/12 106/491 |
| 2015/0099078 A1 | * | 4/2015 | Fish | B29C 70/462 428/36.4 |

FOREIGN PATENT DOCUMENTS

| | | |
|---|---|---|
| JP | 2008-239489 A | 10/2008 |
| JP | 2012-173428 A | 9/2012 |
| JP | 2012173428 A * | 9/2012 |
| KR | 10-0882409 B1 | 2/2009 |
| KR | 10-2011-0056157 A | 5/2011 |
| KR | 10-2014-0120340 A | 10/2014 |
| KR | 10-2015-0131499 A | 11/2015 |

OTHER PUBLICATIONS

JP-2012173428-A (Year: 2012).*

* cited by examiner

*Primary Examiner* — Stefanie J Cohen
(74) *Attorney, Agent, or Firm* — Novick, Kim & Lee, PLLC; Jae Youn Kim

(57) ABSTRACT

The present invention relates to an anti-reflective coating solution composition and an anti-reflective coating film using the same. More particularly, an anti-reflective coating solution composition is provided, which has a low refractive index to thus improve transmittance and can also increase abrasion resistance to thus maintain an anti-reflective effect for a long period of time, whereby an anti-reflective coating film for improving solar cell module efficiency can be formed, and thus can be applied not only to a solar cell module glass but also to glass in a variety of fields.

8 Claims, No Drawings

ANTI-REFLECTION COATING COMPOSITION AND ANTI-REFLECTION FILM UTILIZING SAME

TECHNICAL FIELD

The present invention relates to an anti-reflective coating solution composition and an anti-reflective coating film using the same.

BACKGROUND ART

With the drastic increase in energy use by humans, the demand for production of energy to be used is simultaneously increasing. Although energy is produced from nuclear power plants, which are currently the most widely used among various energy production methods, there is, on the other hand, real concern about the risk of using nuclear power plants and the effect of waste thereof on the environment. In contrast, solar light gives the earth considerable energy without environmental pollution or risks associated with the use thereof, but humans have not yet become able to utilize most such energy.

Recently, as the exhaustion of existing energy resources is expected, interest in alternative energy sources to replace them is increasing. Among them, a solar cell is receiving attention as a next-generation power source that directly converts solar energy into electrical energy using a semiconductor device.

The most basic structure of a solar cell is a diode composed of a PN junction, and solar cells may be classified into crystalline (monocrystalline, polycrystalline) wafer-type solar cells and thin-film (amorphous, polycrystalline) solar cells depending on the material of the light absorption layer.

A solar cell typically includes a solar cell module, configured such that a solar cell element, such as silicon, gallium-arsenic, a copper-indium-selenide (CIS)-based compound, a copper-indium-gallium-selenide (CIGS)-based compound, or a CdTe compound, is protected with an upper transparent protection member and a lower substrate protection member and such that the solar cell element and the protection member are fixed using an adhesive sheet.

In the solar cell module, the upper transparent protection member is typically glass, that is, cover glass, but the glass reflects solar light, undesirably deteriorating the power generation efficiency of the solar cell module. Accordingly, many attempts have been made to form an anti-reflective film on the solar cell module using an anti-reflective coating solution composition. Such an anti-reflective film is able to form a low-refractive-index layer, and thus properties such as low reflectance, high transmittance and high durability are required.

Meanwhile, when glass having a predetermined pattern is located on the outermost surface of the solar cell module, the amount of solar light that is incident on the solar cell module may be increased, compared to when glass having no pattern is used. Recently, developed are techniques in which an anti-reflective coating film is formed on the surface of the glass opposite the surface having a pattern to thereby further increase the amount of solar light that is incident on the solar cell module. When an anti-reflective coating film is used, transmittance may be expected to be increased by about 3% compared to when no anti-reflective coating film is used.

However, the anti-reflective coating film having high transmittance exhibits poor durability, making it difficult to maintain the initial transmittance thereof. On the other hand, an anti-reflective coating film having good durability may manifest poor transmittance.

Thus, there is a need to develop an anti-reflective coating solution composition in which a refractive index is lowered to thus increase transmittance and in which durability such as abrasion resistance is superior.

With regard to the anti-reflective coating solution composition having a low refractive index and high durability, such as abrasion resistance, in order to increase the solar cell module efficiency, Korean Patent No. 1021659, entitled ⌈Method of preparing coating solution for increasing light transmittance in order to serve for solar cell module glass and coating solution composition prepared thereby⌋, discloses a method of preparing a coating solution that is able to increase light transmittance in order to serve for a solar cell module glass, the method including the first step in which 0.05 g of brij-56 (poly(oxyethylene) nonionic surfactant) and polyvinylpyrrolidone are added to give aluminum alkoxide having high reactivity, to which an aggregation inducer that causes a sol-gel reaction is then added, whereby aggregation is induced through a sol-gel reaction, thus forming particles having a size of 100 nm to 500 nm. Moreover, Korean Patent No. 0737131, entitled ⌈Low-refractive-index-layer coating solution for anti-reflective film and anti-reflective film using the same⌋, discloses an anti-reflective film having superior properties, such as a low reflective index and high visible light transmittance, which includes a fluorinated compound, prepared by substituting the crosslinkable portion of an existing fluorine-based acrylic and methacrylic resin with fluorine so that the fluorine content of a cured product after a coating process may be increased.

DISCLOSURE

Technical Problem

Accordingly, the present invention is intended to provide an anti-reflective coating solution composition, which has a low refractive index to thus improve transmittance and increases abrasion resistance to thus maintain an anti-reflective effect for a long period of time.

In addition, the present invention is intended to provide an anti-reflective coating film using the anti-reflective coating solution composition.

Technical Solution

Therefore, the present invention provides an anti-reflective coating solution composition, comprising a compound represented by Chemical Formula 1 below, a water-soluble organic solvent, and water:

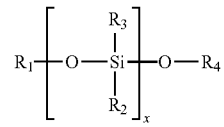

in Chemical Formula 1, X is an integer selected from among 15 to 25, $R_1$ is selected from the group consisting of $CH_3$, $CH_2$, $CH_4$, $C_3H_6$, $C_4H_8$ and $C_5H_{10}$, $R_2$ is selected from the group consisting of H, $CH_3$, $C_2H_5$, $C_3H_7$, $C_4H_9$, $C_5H_{11}$, $OCH_3$, $OC_2H_5$, $OC_3H_7$, $OC_4H_9$ and $OC_5H_{11}$, $R_3$ is selected from the group consisting of H, $CH_3$, $C_2H_5$, $C_3H_7$, $C_4H_9$, $C_5H_{11}$, $OCH_3$, $OC_2H_5$, $OC_3H_7$, $OC_4H_9$ and $OC_5H_{11}$, and $R_4$ is selected from the group consisting of H, $CH_3$, $C_2H_5$, $C_3H_7$, $C_4H_9$ and $C_5H_{11}$.

In a preferred embodiment of the present invention, the anti-reflective coating solution composition further comprises an acid catalyst and a nonionic surfactant.

In a preferred embodiment of the present invention, the water-soluble organic solvent is at least one selected from the group consisting of methyl alcohol, ethyl alcohol, benzyl alcohol, isopropyl alcohol, isoamyl alcohol, pentyl alcohol, isobutyl alcohol, butyl alcohol, cetyl alcohol, lauryl alcohol, nonyl alcohol, undecyl alcohol, propylene glycol monomethyl ether, and propylene glycol monomethyl ether acetate.

In a preferred embodiment of the present invention, the acid catalyst is at least one selected from the group consisting of sulfuric acid, hydrochloric acid, sodium nitrate, potassium nitrate, nitric acid, acetic acid, potassium chromate, nitrous acid, perchloric acid, phosphoric acid, and acetic acid.

In a preferred embodiment of the present invention, the nonionic surfactant is at least one selected from the group consisting of polyoxyethylene alkyl phenyl ether, polyoxyethylene alkylether, polyoxyethylene glycol fatty acid ester, an oxypropylene-oxyethylene block copolymer, polyoxyethylene glycol, polyoxyethylene alkylamine ether, polyoxyalkylene glycol monoalkyl ether, polyoxyalkylene styrenated phenyl ether, and polyoxyalkylene alkylether.

In a preferred embodiment of the present invention, the anti-reflective coating solution composition comprises, based on the total weight of the composition, 5 to 30 wt % of the compound represented by Chemical Formula 1, 54 to 86 wt % of the water-soluble organic solvent, and the remainder of water.

In a preferred embodiment of the present invention, the anti-reflective coating solution composition further comprises, based on the total weight of the composition, 0 to 1 wt % of the acid catalyst and 0 to 4 wt % of the nonionic surfactant.

In a preferred embodiment of the present invention, the anti-reflective coating solution composition is used for a solar cell module glass.

Another embodiment of the present invention provides an anti-reflective coating film, manufactured by coating at least one surface of a solar cell module glass with the anti-reflective coating solution composition as described above and then performing curing.

Advantageous Effects

According to the present invention, an anti-reflective coating solution composition has a low refractive index to thus improve transmittance, and can increase abrasion resistance to thus maintain an anti-reflective effect for a long period of time, thereby exhibiting high efficiency for a long period of time compared to conventional anti-reflective films.

BEST MODE

Unless otherwise defined, all technical and scientific terms used herein have the same meanings as those typically understood by those skilled in the art to which the present invention belongs. Generally, the nomenclature used herein is well known in the art and is typical.

As used herein, when any part is said to "comprise" or "include" any element, this does not mean that other elements are excluded, and such other elements may be further included unless otherwise specifically mentioned.

An embodiment of the present invention addresses an anti-reflective coating solution composition, comprising a compound represented by Chemical Formula 1 below, a water-soluble organic solvent, and water.

[Chemical Formula 1]

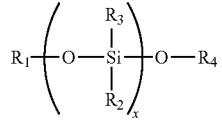

in Chemical Formula 1, X is an integer selected from among 15 to 25, $R_1$ is selected from the group consisting of $CH_2$, $C_2H_4$, $C_3H_6$, $C_4H_8$ and $C_5H_{10}$, $R_2$ is selected from the group consisting of H, $CH_3$, $C_2H_5$, $C_3H_7$, $C_4H_9$, $C_5H_{11}$, $OCH_3$, $OC_2H_5$, $OC_3H_7$, $OC_4H_9$ and $OC_5H_{11}$, $R_3$ is selected from the group consisting of H, $CH_3$, $C_2H_5$, $C_3H_7$, $C_4H_9$, $C_5H_{11}$, $OCH_3$, $OC_2H_5$, $OC_3H_7$, $OC_4H_9$ and $OC_5H_{11}$, and $R_4$ is selected from the group consisting of H, $CH_3$, $C_2H_5$, $C_3H_7$, $C_4H_9$ and $C_5H_{11}$.

The compound represented by Chemical Formula 1 is a methyl trimethoxysilane polymer, and when the compound represented by Chemical Formula 1 is dispersed in the water-soluble organic solvent, a sol may result, thereby adjusting the refractive index and abrasion resistance of the anti-reflective coating film.

The compound represented by Chemical Formula 1 is thermally cured to give a coating film, in which silica particles having a diameter ranging from tens to hundreds of nm are formed and pores are formed between the particles. The formed pores contain air therein and thus when light is transmitted therethrough, the refractive index is adjusted while light passes through the silica layer and the air layer, which have different refractive indices.

The compound represented by Chemical Formula 1 may have abrasion resistance that varies depending on the degree of polymerization thereof. When the compound represented by Chemical Formula 1, the degree of polymerization of which is a predetermined level or more, is used, abrasion resistance may be improved but the formation of pores is not easy, making it difficult to decrease the refractive index. On the other hand, when the compound represented by Chemical Formula 1, the degree of polymerization of which is a predetermined level or less, is used, abrasion resistance is poor but the formation of pores is easy, thus facilitating a decrease in the refractive index.

In the compound represented by Chemical Formula 1, X is preferably an integer selected from among 15 to 25. If X in the compound represented by Chemical Formula 1 is less than 15, the abrasion resistance of the anti-reflective coating film may become poor. On the other hand, if X exceeds 25, the refractive index of the anti-reflective film is high, and thus transmittance may decrease, which is undesirable.

As described above, in the case where the anti-reflective coating film has poor abrasion resistance, durability may deteriorate, and thus anti-reflective coating effects cannot be maintained for a long period of time. In the case where the refractive index of the anti-reflective coating film increases, the increase in transmittance is not sufficient, and thus anti-reflective effects cannot be obtained. Accordingly, in order to increase transmittance, it is important that the durability of the anti-reflective film is maintained while also maintaining the low refractive index thereof.

In a preferred aspect of the present invention, the anti-reflective coating solution composition may further include an acid catalyst and a nonionic surfactant.

The anti-reflective coating solution composition may include, based on the total weight of the composition, 5 to 30 wt % of the compound represented by Chemical Formula 1, 54 to 86 wt % of the water-soluble organic solvent, and the remainder of water.

The compound represented by Chemical Formula 1 is preferably used in an amount of 1 to 50 wt %, and more preferably to 30 wt %, based on the total weight of the composition. If the amount of the compound represented by Chemical Formula 1 is less than 1 wt %, it is difficult to ensure an appropriate anti-reflective coating thickness, which is undesirable. On the other hand, if the amount thereof exceeds 50 wt %, the resulting coating film may become thick, making it difficult to obtain appropriate transmittance, and moreover, additional dilution is required, which is undesirable.

The thickness of the anti-reflective coating film may be adjusted depending on the refractive index of the anti-reflective coating film. In the anti-reflective coating film according to the present invention, a thickness of 100 to 120 nm is appropriate. If the thickness of the anti-reflective coating film is less than 100 nm, abrasion resistance may deteriorate. On the other hand, if the thickness of the anti-reflective coating film exceeds 120 nm, light transmittance may decrease, which is undesirable.

The water-soluble organic solvent is preferably used in an amount of 54 to 95 wt % based on the total weight of the composition. If the amount of the water-soluble organic solvent is less than 54 wt %, solid content is increased based on the total amount of the composition, and thus it is difficult to obtain appropriate thickness of the anti-reflective coating film. On the other hand, if the amount thereof exceeds 95 wt %, solid content is decreased based on the total amount of the composition, and thus it is impossible to obtain appropriate thickness of the anti-reflective coating film, which is undesirable.

The water-soluble organic solvent may be at least one selected from the group consisting of methyl alcohol, ethyl alcohol, benzyl alcohol, isopropyl alcohol, isoamyl alcohol, pentyl alcohol, isobutyl alcohol, butyl alcohol, cetyl alcohol, lauryl alcohol, nonyl alcohol, undecyl alcohol, propylene glycol monomethyl ether, and propylene glycol monomethyl ether acetate.

The anti-reflective coating solution composition may further include, based on the total weight of the composition, 0 to 1 wt % of the acid catalyst and 0 to 4 wt % of the nonionic surfactant.

The acid catalyst is preferably used in an amount of 0 to 1 wt %, based on the total weight of the composition. If the amount of the acid catalyst exceeds 1 wt %, bonding of the compound represented by Chemical Formula 1 is enhanced, and thus abrasion resistance may be improved but the refractive index may deteriorate, which is undesirable.

The acid catalyst may be at least one selected from the group consisting of sulfuric acid, hydrochloric acid, sodium nitrate, potassium nitrate, nitric acid, acetic acid, potassium chromate, nitrous acid, perchloric acid, phosphoric acid, and acetic acid.

The nonionic surfactant is preferably used in an amount of 0 to 4 wt % based on the total weight of the composition. If the amount of the nonionic surfactant exceeds 4 wt %, the abrasion resistance of the coating film may deteriorate, which is undesirable.

The nonionic surfactant may be at least one selected from the group consisting of polyoxyethylene alkyl phenyl ether, polyoxyethylene alkylether, polyoxyethylene glycol fatty acid ester, an oxypropylene-oxyethylene block copolymer, polyoxyethylene glycol, polyoxyethylene alkylamine ether, polyoxyalkylene glycol monoalkyl ether, polyoxyalkylene styrenated phenyl ether, and polyoxyalkylene alkylether.

The anti-reflective coating solution composition may be efficiently applied to a solar cell module glass.

As described above, the anti-reflective coating solution composition according to the present invention includes the compound represented by Chemical Formula 1, and thus has a low refractive index to thus improve transmittance and can also increase abrasion resistance to thereby maintain anti-reflective effects for a long period of time, ultimately exhibiting high efficiency for a long period of time compared to conventional anti-reflective films.

Another embodiment of the present invention addresses an anti-reflective coating film, manufactured by coating at least one surface of a solar cell module glass with the anti-reflective coating solution composition described above and then performing curing.

The anti-reflective coating film is formed from the anti-reflective coating solution composition in order to increase solar cell module efficiency and may thus be effectively applied not only to the solar cell module glass but also to glass in a variety of fields.

EXAMPLES

A better understanding of the present invention may be obtained through the following examples, which are set forth to illustrate, but are not to be construed as limiting the scope of the present invention, as will be apparent to those skilled in the art.

Example 1

An anti-reflective coating solution composition was prepared by mixing 25.0 g of a compound represented by Chemical Formula 1 below (X=5, $R_1$=$CH_2$, $R_2$=$OCH_3$, $R_3$=$CH_3$, $R_4$=$CH_3$), 69.5 g of isopropyl alcohol, and 0.5 g of nitric acid with 5 g of water.

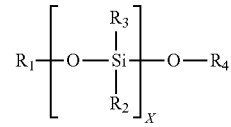

Example 2

An anti-reflective coating solution composition was prepared by mixing 25.0 g of a compound represented by Chemical Formula 1 (X=15, $R_1$=$CH_3$, $R_2$=$OCH_3$, $R_3$=$CH_3$, $R_4$=$CH_2$) r, 69.5 g of isopropyl alcohol, and 0.5 g of nitric acid with 5 g of water.

Example 3

An anti-reflective coating solution composition was prepared by mixing 25.0 g of a compound represented by Chemical Formula 1 (X=25, $R_1$=$CH_3$, $R_2$=$OCH_3$, $R_3$=$CH_3$, $R_4$=$CH_2$), 69.5 g of isopropyl alcohol, and 0.5 g of nitric acid with 5 g of water.

Example 4

An anti-reflective coating solution composition was prepared by mixing 25.0 g of a compound represented by Chemical Formula 1 (X=50, $R_1$=$CH_3$, $R_2$=$OCH_3$, $R_3$=$CH_3$, $R_4$=$CH_2$), 69.5 g of isopropyl alcohol, and 0.5 g of nitric acid with 5 g of water.

Example 5

An anti-reflective coating solution composition was prepared by mixing 25.0 g of a compound represented by Chemical Formula 1 (X=100, $R_1$=$CH_3$, $R_2$=$OCH_3$, $R_3$=$CH_3$, $R_4$=$CH_2$), 69.5 g of isopropyl alcohol, and 0.5 g of nitric acid with 5 g of water.

Example 6

An anti-reflective coating solution composition was prepared by mixing 25.0 g of a compound represented by Chemical Formula 1 (X=15, $R_1$=$CH_3$, $R_2$=$OCH_3$, $R_3$=$CH_3$, $R_4$=$CH_2$) r, 69.5 g of isopropyl alcohol, 0.5 g of nitric acid, and 1.0 g of an oxypropylene-oxyethylene block copolymer with 4 g of water.

Example 7

An anti-reflective coating solution composition was prepared by mixing 25.0 g of a compound represented by Chemical Formula 1 (X=15, $R_1$=$CH_3$, $R_2$=$OCH_3$, $R_3$=$CH_3$, $R_4$=$CH_2$), 69.5 g of isopropyl alcohol, 0.5 g of nitric acid, and 2.0 g of an oxypropylene-oxyethylene block copolymer with 3 g of water.

Example 8

An anti-reflective coating solution composition was prepared by mixing 25.0 g of a compound represented by Chemical Formula 1 (X=15, $R_1$=$CH_3$, $R_2$=$OCH_3$, $R_3$=$CH_3$, $R_4$=$CH_2$), 69.5 g of isopropyl alcohol, 0.5 g of nitric acid, and 3.0 g of an oxypropylene-oxyethylene block copolymer with 2 g of water.

Example 9

An anti-reflective coating solution composition was prepared by mixing 25.0 g of a compound represented by Chemical Formula 1 (X=15, $R_1$=$CH_3$, $R_2$=$OCH_3$, $R_3$=$CH_3$, $R_4$=$CH_2$), 69.5 g of isopropyl alcohol, 0.5 g of nitric acid, and 5.0 g of an oxypropylene-oxyethylene block copolymer.

Measurement of Refractive Index and Abrasion Resistance

The anti-reflective coating solution compositions prepared in Examples 1 to 9 were measured for refractive index and abrasion resistance.

Each anti-reflective coating solution composition was sufficiently applied on a piece of glass to be used for a solar cell, and cured with heat at 730° C. for 2 min 30 sec, thus manufacturing an anti-reflective coating film.

The refractive index was measured using an ellipsometer (M2000D, made by WOLLAM), and abrasion resistance was evaluated with the naked eye after rubbing using a medium-sized KIMTECH Science Wiper 41117.

TABLE 1

| | X in Chemical Formula 1 | Nonionic surfactant (g) (Oxypropylene-oxyethylene block copolymer) | Refractive index @ 633 nm | Abrasion resistance |
|---|---|---|---|---|
| Example 1 | 5 | — | 1.32 | Poor |
| Example 2 | 15 | — | 1.36 | Good |
| Example 3 | 25 | — | 1.37 | Good |
| Example 4 | 50 | — | 1.39 | Good |
| Example 5 | 100 | — | 1.40 | Good |
| Example 6 | 15 | 1.0 | 1.32 | Good |
| Example 7 | 15 | 2.0 | 1.29 | Good |
| Example 8 | 15 | 3.0 | 1.28 | Fair |
| Example 9 | 15 | 5.0 | 1.23 | Poor |

As is apparent from Table 1, among Examples 1 to 5, in Example 1, in which X of Chemical Formula 1 was 5, the refractive index was decreased but abrasion resistance was poor, and in Examples 4 and 5, in which X of Chemical Formula 1 was 50 and 100, respectively, abrasion resistance was good but the refractive index was high.

Thus, when X of Chemical Formula 1 fell in the range of 15 to 25, as in Examples 2 and 3, abrasion resistance was superior and the refractive index was decreased.

Furthermore, compared to Example 2, in which X of Chemical Formula 1 was 15, Examples 6 to 9, in which X of Chemical Formula 1 was 15 and the nonionic surfactant was further added, were remarkably decreased in refractive index. However, in the case where the nonionic surfactant was excessively added, abrasion resistance was somewhat deteriorated. Hence, when the nonionic surfactant was added in an amount of 4 wt % or less based on the total weight of the composition, abrasion resistance was maintained and the refractive index was considerably decreased.

All simple modifications or variations of the present invention may be easily performed by those skilled in the art, and may be incorporated within the scope of the present invention.

The invention claimed is:

1. An anti-reflective coating solution composition, comprising:
   a compound represented by Chemical Formula 1 below;
   a water-soluble organic solvent; and
   water:

[Chemical Formula 1]

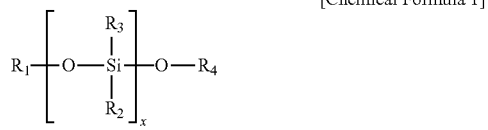

in Chemical Formula 1, X is an integer selected from among 15 to 25,
$R_1$ is $CH_3$,
$R_2$ is $OCH_3$,
$R_3$ is $CH_3$, and
$R_4$ is $CH_3$,
wherein the anti-reflective coating solution composition comprises, based on a total weight of the composition, 5 to 30 wt % of the compound represented by Chemical Formula 1, 54 to 86 wt % of the water-soluble organic solvent, and a remainder of the water.

2. The anti-reflective coating solution composition of claim 1, further comprising an acid catalyst and a nonionic surfactant.

3. The anti-reflective coating solution composition of claim 1, wherein the water-soluble organic solvent is at least one selected from the group consisting of methyl alcohol, ethyl alcohol, benzyl alcohol, isopropyl alcohol, isoamyl alcohol, pentyl alcohol, isobutyl alcohol, butyl alcohol, cetyl alcohol, lauryl alcohol, nonyl alcohol, undecyl alcohol, propylene glycol monomethyl ether, and propylene glycol monomethyl ether acetate.

4. The anti-reflective coating solution composition of claim 2, wherein the acid catalyst is at least one selected from the group consisting of sulfuric acid, hydrochloric acid, sodium nitrate, potassium nitrate, nitric acid, acetic acid, potassium chromate, nitrous acid, perchloric acid, phosphoric acid, and acetic acid.

5. The anti-reflective coating solution composition of claim 2, wherein the nonionic surfactant is at least one selected from the group consisting of polyoxyethylene alkyl phenyl ether, polyoxyethylene alkylether, polyoxyethylene glycol fatty acid ester, an oxypropylene-oxyethylene block copolymer, polyoxyethylene glycol, polyoxyethylene alkylamine ether, polyoxyalkylene glycol monoalkyl ether, polyoxyalkylene styrenated phenyl ether, and polyoxyalkylene alkylether.

6. The anti-reflective coating solution composition of claim 1, wherein the anti-reflective coating solution composition further comprises, based on the total weight of the composition, 0.5 to 1 wt % of an acid catalyst and 1 to 4 wt % of a nonionic surfactant.

7. The anti-reflective coating solution composition of claim 1, wherein the anti-reflective coating solution composition is used for a solar cell module glass.

8. An anti-reflective coating film, manufactured by coating at least one surface of a solar cell module glass with the anti-reflective coating solution composition of claim 1 and then performing curing.

* * * * *